United States Patent
Baier

[19]

[11] Patent Number: 6,131,739
[45] Date of Patent: Oct. 17, 2000

[54] FRACTURE-PROOF CONTAINER FOR WAFER DISCS

[75] Inventor: Claus Baier, Wald-Michelbach, Germany

[73] Assignee: Wacker Siltronic AG, Burghausen, Germany

[21] Appl. No.: 09/076,652

[22] Filed: May 12, 1998

[30] Foreign Application Priority Data

Sep. 26, 1997 [DE] Germany ................. 297 17 254 U

[51] Int. Cl.$^7$ ................................................. B65D 85/38
[52] U.S. Cl. ............................................. 206/710; 206/592
[58] Field of Search .................................. 206/710–712, 206/722–725, 521, 523, 454, 459.5, 591, 592, 594; 220/4.21, 4.24; 211/41.18

[56] References Cited

U.S. PATENT DOCUMENTS

| | | | |
|---|---|---|---|
| 3,191,791 | 6/1965 | Jackson | 206/725 |
| 5,203,452 | 4/1993 | Small et al. | 206/725 |
| 5,366,080 | 11/1994 | Carstersen et al. | 206/723 |
| 5,400,904 | 3/1995 | Maston, III et al. | 206/725 |
| 5,418,692 | 5/1995 | Nemoto | 206/725 |
| 5,531,329 | 7/1996 | Hayakawa et al. | 206/722 |
| 5,706,951 | 1/1998 | Oinuma et al. | 206/710 |
| 5,791,486 | 8/1998 | Brahmbhatt | 206/725 |
| 5,794,783 | 8/1998 | Carter | 206/725 |
| 5,875,896 | 3/1999 | Liang | 206/710 |

*Primary Examiner*—Paul T. Sewell
*Assistant Examiner*—Luan K. Bui
*Attorney, Agent, or Firm*—Collard & Roe, P.C.

[57] ABSTRACT

A fracture-proof container for wafer discs including two half-shells having a substantially rectangular cross-section and each including a plurality of substantially rectangular chambers, a substantially rectangular opening formed in a bottom of each chamber, limiting walls surrounding the chambers, and a plurality of substantially rectangular ribs formed on an outer side of each half-shell.

5 Claims, 5 Drawing Sheets

Fig. 7
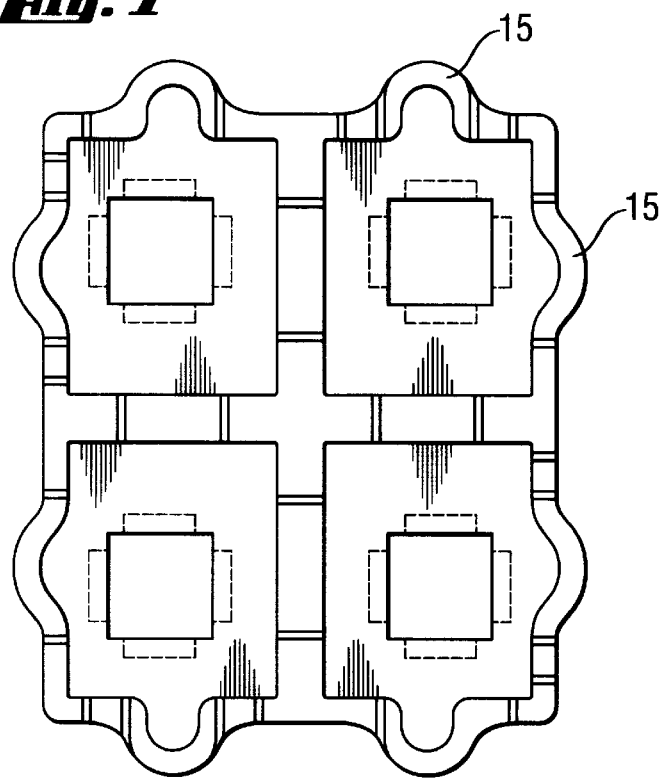
Fig. 8
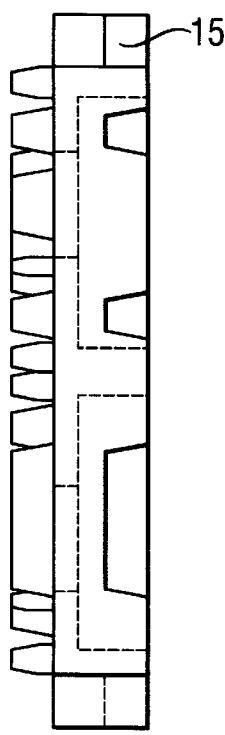
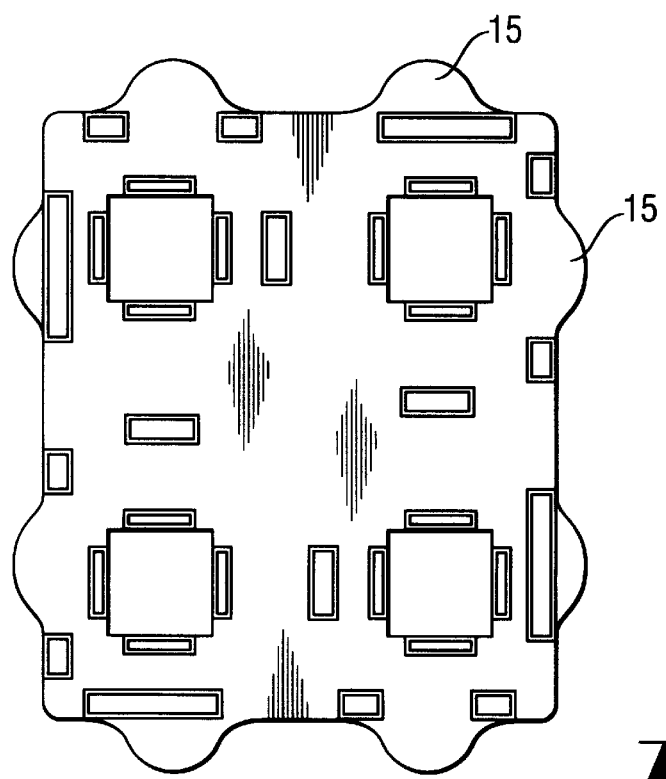
Fig. 9

6,131,739

FRACTURE-PROOF CONTAINER FOR WAFER DISCS

BACKGROUND OF THE INVENTION

1. Field of the Invention

The present invention relates to a container for wafer discs.

2. Description of the Prior Art

Containers for fracture-sensitive goods such as, e.g., wafer discs, which are formed as collapsible cardboard boxes with foam inserts, are known. These collapsible cardboard boxes are not very attractive and have very limited damping characteristics, and a significant portion of wafer discs, which are transported in these boxes, is subjected to fracture. Large containers for transporting the wafer discs should meet such fracture-proof requirements in order to prevent fracturing of the transported wafer discs which cannot be achieved with the known collapsible cardboard boxes.

Accordingly an object of the present invention is to provide a fracture-proof container for wafer discs which would prevent fracturing of wafers and, at the same time, would have an attractive appearance.

SUMMARY OF THE INVENTION

This and other objects of the present invention, which will become apparent hereinafter, are achieved by providing a fracture-proof container for wafer discs which is formed of two half-shells having a substantially rectangular cross-section. Each half-shell includes a plurality of substantially rectangular chambers for receiving wafer discs. A substantially rectangular opening is formed in a bottom of each chamber, and there are provided limiting walls surrounding the chambers.

A plurality of substantially rectangular ribs are formed on outer side of at least one half-shell.

According to the invention, boxes with wafer discs can be placed in the chambers the dimensions of which correspond to the size of the boxes, so that the boxes, when placed in a container, are surrounded from all sides, when two half-shelves are assembled together. This prevents any damage to the boxes with wafer discs, as the container prevents the boxes from any shocks, vibrations, etc. . . which can damage the wafer discs, by absorbing such shocks, vibrations, etc. . .

The fracture-proof container according to the present invention can be economically produced for receiving boxes of different sizes and shapes. The ribs provided on the outer sides of the half-shells improve stacking of the container and also dampen shocks, vibrations, etc. . . The openings, which are provided in bottoms of the chambers, permit to view box labels when the boxes being located in a container.

According to an advantageous embodiment of the invention, a half-shell can be formed with two or four chambers.

According to a further advantageous embodiment of the present invention, the limiting walls, which are provided on the periphery of a half-shell are provided with an arcurate section for better absorption of shocks and vibrations.

According to a still further advantageous embodiment of the present invention, the limiting walls are formed with rhomb-shaped bosses advantageously provided with cylindrical locating elements.

According to the invention, the ribs, which are provided at the free edges of a half-shell, are arranged symmetrically with respect to the half-shell center. This provides for reinforcement of the edges and insures a predetermined stacking of the containers.

According to the invention, the container is formed of a foam material, such as foam polystyrene or polypropylene.

DESCRIPTION OF THE DRAWINGS

The features and objects of the present invention will become more apparent, and the invention itself will be best understood from the following detailed description of the preferred embodiments when read with reference to the accompanying drawings, where:

FIG. 7 shows a plane view of a further embodiment of a fracture-proof container for wafer discs according to the preset invention;

FIG. 8 shows a side view of the further embodiment of a fracture-proof container according to the present invention;

FIG. 9 shows a bottom view the further embodiment of a fracture-proof container according to the present invention;

DETAILED DESCRIPTION OF THE PREFERRED EMBODIMENTS

Figure 1:
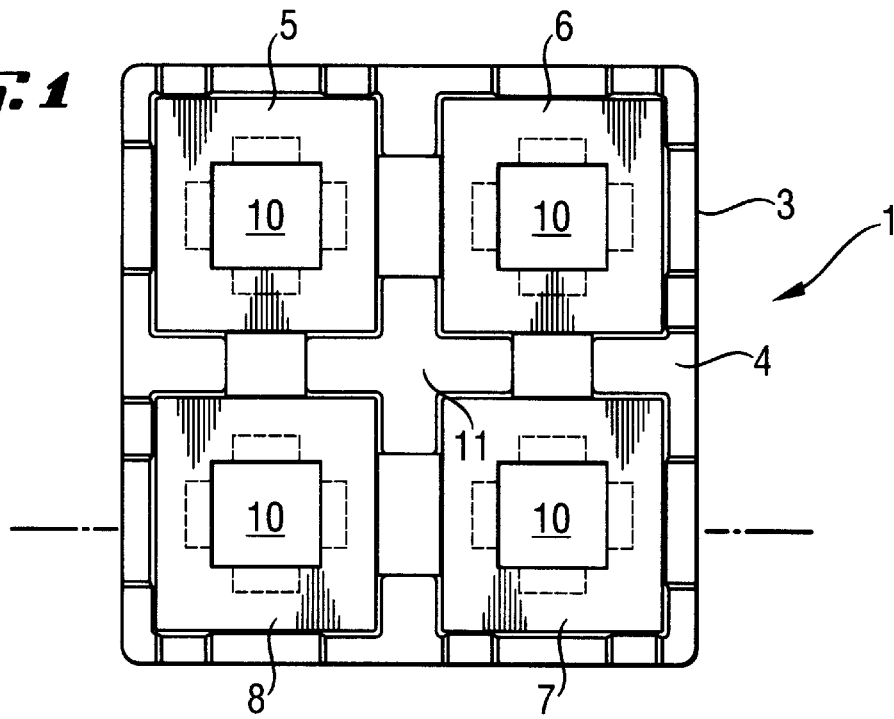
FIG. 1 shows a plan view of a fracture-proof container for wafer discs according to the present invention.
Figure 2:
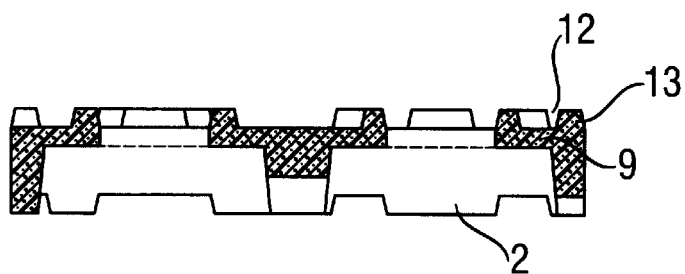
FIG. 2 shows a sectional view of FIG. 1 of a fracture-proof container according to the present invention.
Figure 3:
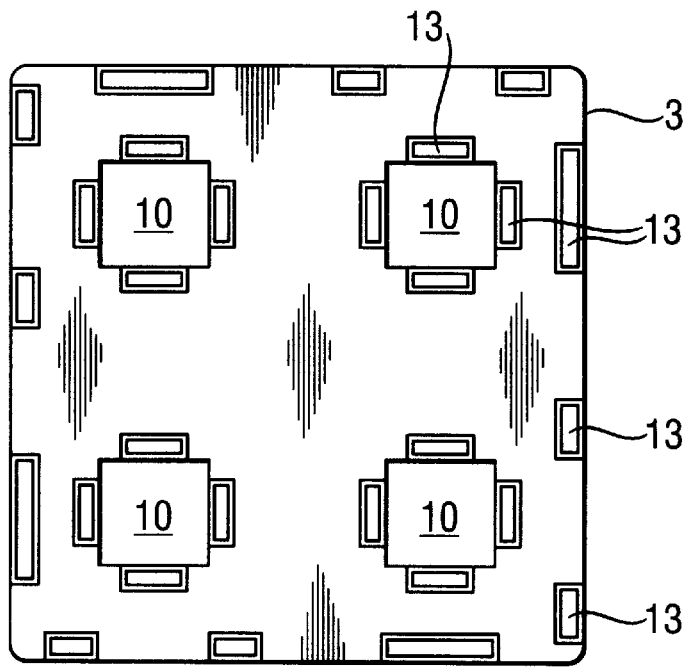
FIG. 3 shows a bottom view of a fracture-proof container according to the present invention.

A fracture-proof container for wafer discs according to the present invention, which is shown in FIGS. 1–3, has a substantially rectangular half-shell with the lengths of longitudinal and transverse edges being equal to about 400 mm and 360 mm, respectively. Along its entire periphery 3, the half-shell 1 is provided, at a inner side 2, with a plurality of limiting walls 4 having a height of about 80 mm. The half-shell 1 is formed of a foam polystyrene or propylene.

On its inner side 2, two perpendicular limiting walls 4 divide the half-shell 1 in four substantially identical chambers 5, 6, 7, 8. In the center of each chamber 5, 6, 7 and 8, in the bottom of the chamber, an opening 10 is formed. The two perpendicular walls 4 have, in their crossing point, a raised surface 11 which can be used for identifying the designation of the half-shell, e.g., for storing and transporting boxes (not shown) for wafer discs type 100.

The half-shell 1 is provided, on an outer side 12 along free edges of the openings 10 and the periphery 3, with ribs 13 which are arranged on the half-shell 1 symmetrically with respect to the center of the half-shell 1. The boxes with wafer discs are placed in the chambers 5, 6, 7, 8 of the upper half-shell 1, with another half-shelf being connected with the upper half-shell 1 and covering the boxes with the wafer discs.

Figure 4:
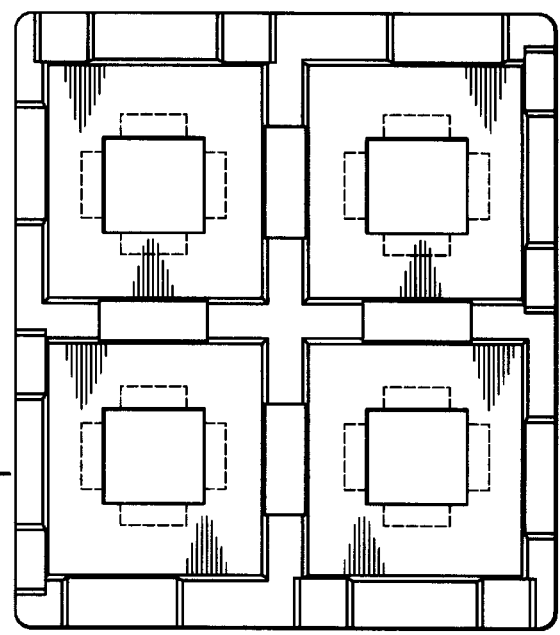
FIG. 4 shows a plane view of an alternative embodiment of a fracture-proof container for wafer discs according to the present invention.
Figure 5:
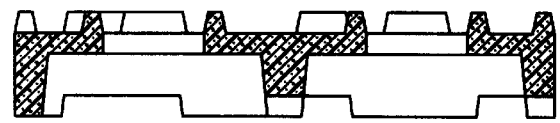
FIG. 5 shows a sectional view of FIG. 4 of the alternative embodiment of a fracture-proof container according to the present invention.
Figure 6:
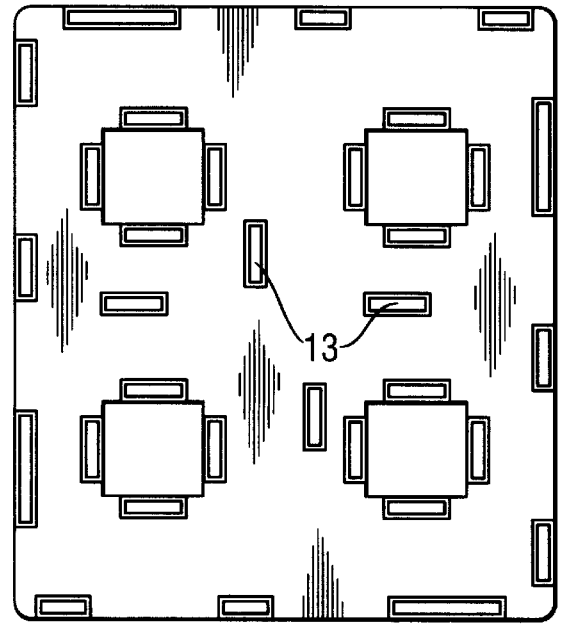
FIG. 6 shows a bottom view of the alternative embodiment of a fracture-proof container according to the present invention.
Figure 10:
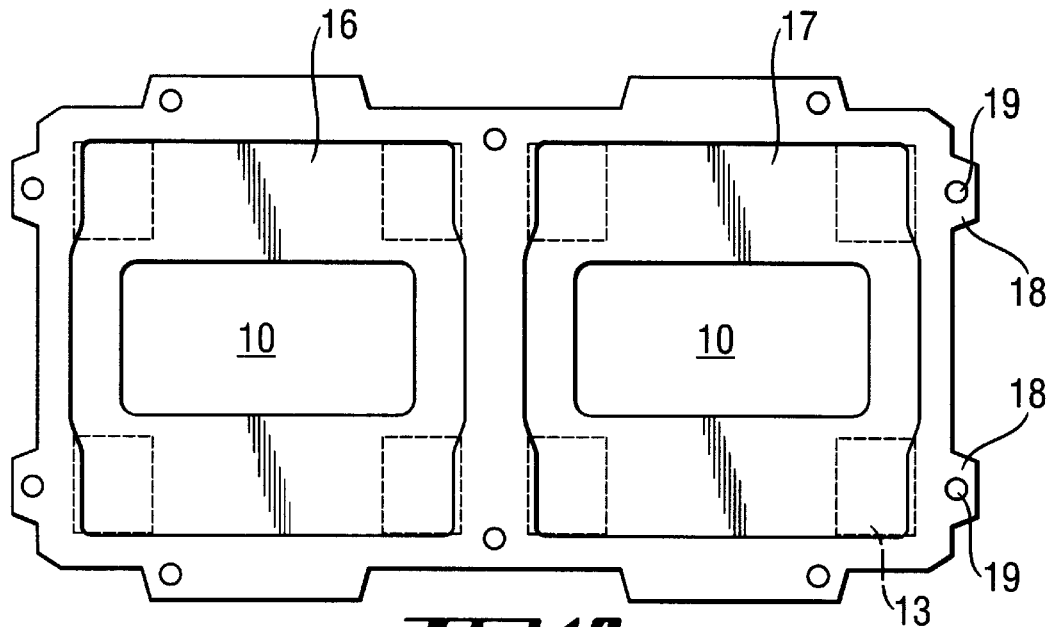
FIG. 10 shows a plane view of an upper half-shell of a fracture-proof container according to the present invention with two chambers.
Figure 11:
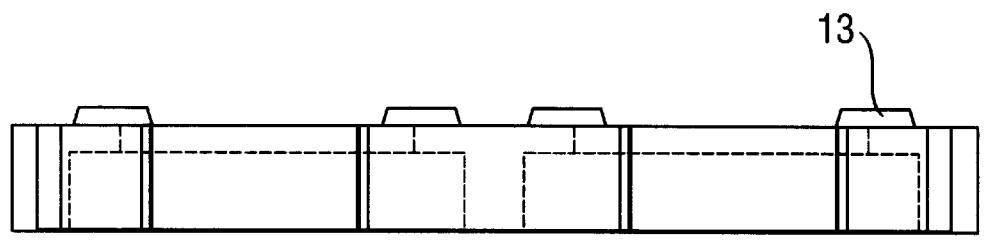
FIG. 11 shows a side view of an upper half-shell of a fracture-proof container according to the present invention with two chambers.
Figure 12:
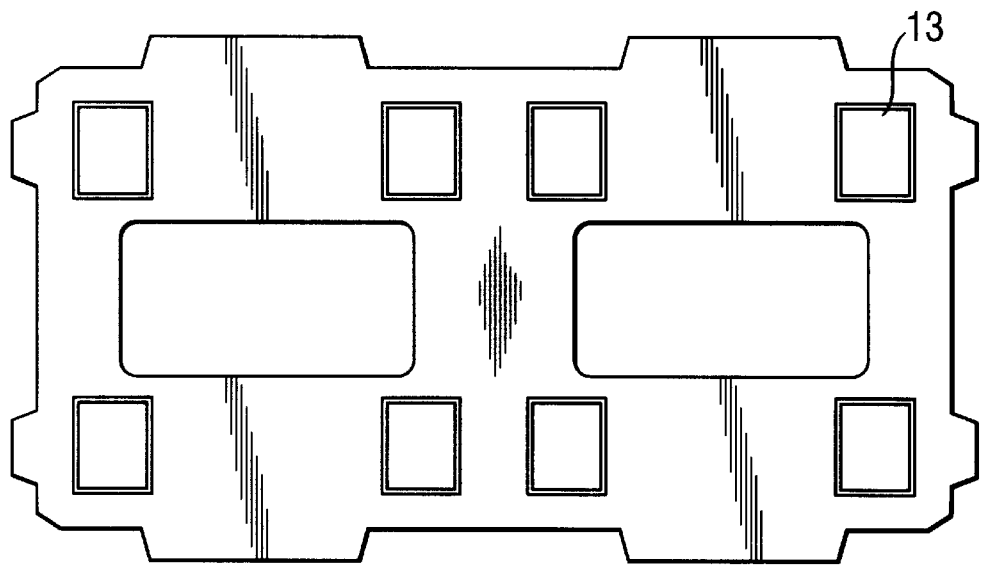
FIG. 12 shows a bottom view of an upper half-shell of a fracture-proof container according to the present invention with two chambers.
Figure 13:
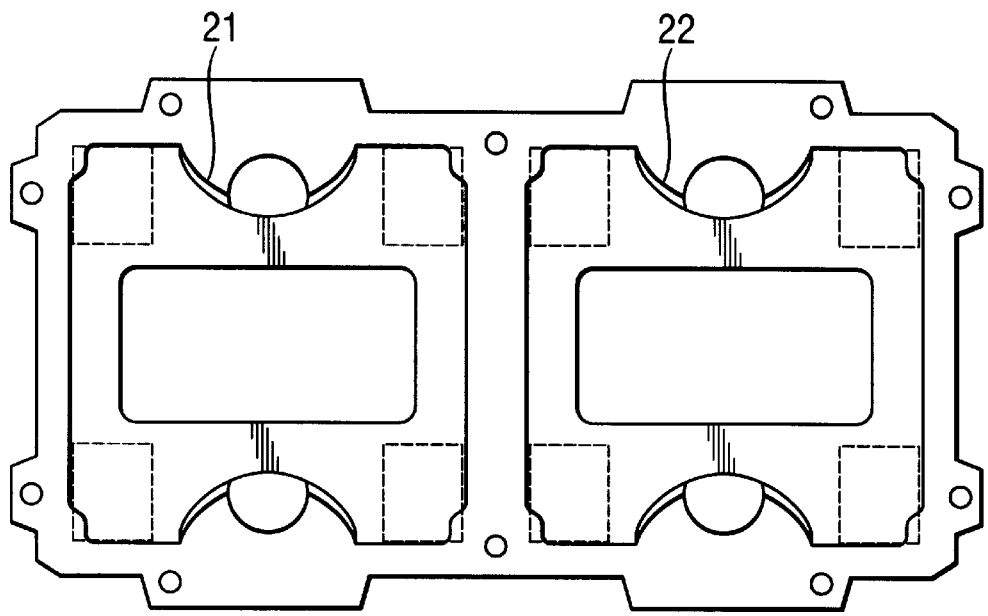
FIG. 13 shows a plan view of a lower half-shell of a fracture-proof container according to the present invention with two chambers.
Figure 14:
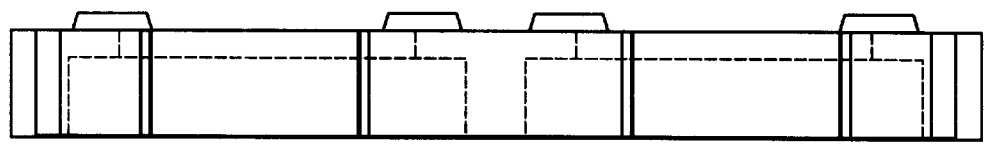
FIG. 14 shows a side view of a lower half-shell of a fracture-proof container according to the present invention with two chambers.
Figure 15:
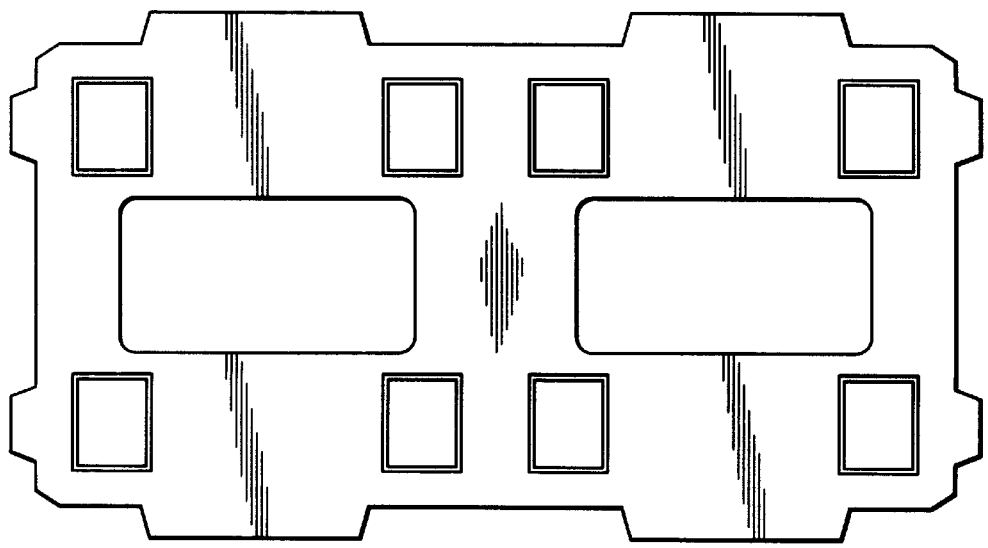
FIG. 15 shows a bottom view of a lower half-shell of a fracture-proof container according to the present invention with two chambers.

Another embodiment of a fracture-proof container for wafer discs is shown in FIGS. 4–6 where the same element are designated with the same reference numerals. The container shown in FIGS. 4–6 is bigger than that shown in FIGS. 1–3 and described above. The container shown in FIGS. 4–6 has edge lengths of about 460 and 400 mm, respectively. The ribs 13 occupy a greater surface of the bottom 9 of the half-shell, with the additional ribs 13 being spaced from the free edges of the half-shell.

A still further embodiment of a fracture-proof container for wafer disc according to the present invention is shown in FIGS. 7–9 where again the same elements are designated with the same reference numeral. The container shown in FIGS. 7–9 is bigger than that in FIGS. 1–3 and 4–6 and has edge lengths about 550 and 440 mm, respectively. The half-shell is provided with additional ribs 13, which are spaced from the free edges of the half-shell and, at that, have a larger base surface. The limiting walls 4, which are arranged along the periphery 3 of the half-shell 1, are provided in the region of each of the chambers 5, 6, 7, 8 with two acurate bulges 15.

FIGS. 10–12 and 13–15 shown, as discussed above, upper and lower half-shells with two chambers. In FIGS. 10–15, elements identical to those of FIGS. 1–9 will be designated with the same reference numerals.

The half-shells 1 shown in FIGS. 10–15 are designated for boxes for wafer discs type 200, i.e., for wafer discs having a diameter of 200 mm. The half-shells 1 have edge lengths of about 590 and 320 mm and two chambers 16 and 17. On the outer side 12 of a respective half-shell 1, there are provided large-surface ribs 13 which are spaced from the free edges of the respective half-shell 1. The limiting walls 4 are provided with rhomb-shaped bases 18 each of which has a locating element 19. In the lower half-shell shown in FIGS. 13–15, each of the chambers 16 and 17 is provided, on its opposite longitudinal sides, 20 with arcurate recesses 21 and 22.

Though the present invention was shown and described with references to the preferred embodiments, various modifications thereof will be apparent to those skilled in the art and, therefore, it is not intended that the invention be limited to the disclosed embodiments or details thereof, and departure can be made therefrom with in the spirit and scope of the appended claims.

What is claimed is:

1. A fracture-proof container for accommodating wafer discs, comprising two identical half-shells and wafer boxes receiving the wafer discs;

said wafer boxes being placed in substantially rectangular chambers of the half-shells and a substantially rectangular opening being formed in a bottom of each chamber;

said half-shells each having a substantially rectangular cross-section, limiting walls surrounding the chambers, each of said limiting walls having a rhomb-shaped boss, and a plurality of substantially rectangular ribs formed at free edges on outer side of each half-shell bottom and arranged symmetrically with respect to a center of the half-shell.

2. A container as set forth in claim 1, wherein the half-shells are formed of a foam material.

3. A container as set forth in claim 1, wherein there is a plurality of chambers selected from the group consisting of two chambers and four chambers.

4. A container as set forth in claim 1, wherein each of the limiting walls has an arcurate section.

5. A container as set forth in claim 2, wherein the half-shells are formed of a foam material selected from the group consisting of a foam polystyrene and a foam propylene.

* * * * *

UNITED STATES PATENT AND TRADEMARK OFFICE
CERTIFICATE OF CORRECTION

PATENT NO. : 6,131,739
DATED : October 17, 2000
INVENTOR(S) : Baier et al.

It is certified that error appears in the above-identified patent and that said Letters Patent is hereby corrected as shown below:

<u>Title page,</u>
Line 2 of the heading, change "Baier" to -- Baier et al. --.

Item [75], please add the following inventors:

-- Gottfried Hammerl, Burghausen, Germany;
  Herbert Ott, Tittmoning, Germany --

Signed and Sealed this

First Day of January, 2002

*Attest:*

*Attesting Officer*

JAMES E. ROGAN
*Director of the United States Patent and Trademark Office*